US011854605B2

(12) United States Patent
Ji

(10) Patent No.: US 11,854,605 B2
(45) Date of Patent: Dec. 26, 2023

(54) STATE DETECTION CIRCUIT FOR ANTI-FUSE MEMORY CELL, AND MEMORY

(71) Applicant: CHANGXIN MEMORY TECHNOLOGIES, INC., Hefei (CN)

(72) Inventor: Rumin Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 168 days.

(21) Appl. No.: 17/570,476

(22) Filed: Jan. 7, 2022

(65) Prior Publication Data
US 2022/0130448 A1  Apr. 28, 2022

Related U.S. Application Data

(63) Continuation of application No. PCT/CN2021/097849, filed on Jun. 2, 2021.

(30) Foreign Application Priority Data

Jul. 16, 2020 (CN) .......................... 202010687680.4

(51) Int. Cl.
*G11C 11/4091* (2006.01)
*G11C 11/4074* (2006.01)
(Continued)

(52) U.S. Cl.
CPC ...... *G11C 11/4091* (2013.01); *G11C 11/4074* (2013.01); *G11C 11/4094* (2013.01); *G11C 11/4099* (2013.01); *G11C 17/143* (2013.01)

(58) Field of Classification Search
CPC ............ G11C 11/4091; G11C 11/4074; G11C 11/4094; G11C 11/4099; G11C 17/143;
(Continued)

(56) References Cited

U.S. PATENT DOCUMENTS 7,082,061 B2   7/2006   Chou
7,333,383 B2   2/2008   Vogelsang
(Continued)

FOREIGN PATENT DOCUMENTS

CN   1828764 A     9/2006
CN   100483540 C   4/2009
(Continued)

OTHER PUBLICATIONS

International Search Report in the international application No. PCT/CN2021/097868, dated Aug. 26, 2021, 2 pgs.
(Continued)

*Primary Examiner* — Khamdan N. Alrobaie
(74) *Attorney, Agent, or Firm* — Cooper Legal Group, LLC

(57) ABSTRACT

A state detection circuit for an anti-fuse memory cell includes: amplifier, having first input terminal connected with first reference voltage, second input terminal connected with first node and output terminal connected with second node; anti-fuse memory cell array, including anti-fuse memory cell sub-arrays, bit lines of sub-arrays are connected with first node, word lines of sub-arrays are connected with controller and each sub-array includes anti-fuse memory cells; first switch element, having first terminal connected with power supply, second terminal connected with first node and control terminal connected with second node; second switch element, having first terminal connected with power supply, second terminal connected with third node and control terminal connected with second node; third switch element, having first terminal connected with third node, grounded second terminal and control terminal connected with controller; and comparator, having first and second input terminals connected with third node and second reference voltage respectively.

18 Claims, 12 Drawing Sheets

(51) Int. Cl.
*G11C 11/4094* (2006.01)
*G11C 11/4099* (2006.01)
*G11C 17/14* (2006.01)

(58) Field of Classification Search
CPC ......... G11C 29/50; G11C 17/18; G11C 17/16; G11C 17/165; H10B 20/00; H10B 20/20
See application file for complete search history.

(56) References Cited

U.S. PATENT DOCUMENTS

| | | | |
|---|---|---|---|
| 7,738,281 B2* | 6/2010 | Iida | G11C 11/4094 365/230.08 |
| 8,208,336 B2 | 6/2012 | Do | |
| 8,243,542 B2 | 8/2012 | Bae | |
| 8,654,595 B2 | 2/2014 | Kim | |
| 9,099,191 B2 | 8/2015 | Tsai et al. | |
| 9,330,781 B2 | 5/2016 | Kim et al. | |
| 9,564,235 B2 | 2/2017 | Zhou et al. | |
| 9,712,149 B2* | 7/2017 | Kaeriyama | H03K 17/0828 |
| 10,121,537 B2 | 11/2018 | Rho | |
| 10,403,344 B2 | 9/2019 | Lee | |
| 10,411,710 B1* | 9/2019 | Zhou | H03K 19/17728 |
| 10,446,204 B2 | 10/2019 | Inaba | |
| 10,459,693 B2 | 10/2019 | Lin et al. | |
| 10,658,048 B2 | 5/2020 | Conte et al. | |
| 10,693,369 B2 | 6/2020 | Ku et al. | |
| 2003/0214867 A1* | 11/2003 | Goldman | G11C 7/106 365/207 |
| 2006/0120174 A1 | 6/2006 | Chou | |
| 2007/0097769 A1* | 5/2007 | Tsukada | G11C 11/4091 365/208 |
| 2009/0010081 A1* | 1/2009 | Hirobe | G11C 11/4091 365/207 |
| 2010/0118595 A1 | 5/2010 | Bae | |
| 2010/0277999 A1 | 11/2010 | Do | |
| 2013/0064008 A1 | 3/2013 | Kim et al. | |
| 2013/0235647 A1* | 9/2013 | Kim | G11C 13/0004 365/148 |
| 2014/0355353 A1 | 12/2014 | Tsai et al. | |
| 2015/0078081 A1 | 3/2015 | Zhou et al. | |
| 2015/0287475 A1 | 10/2015 | Kim et al. | |
| 2018/0158523 A1 | 6/2018 | Rho | |
| 2018/0197590 A1 | 7/2018 | Lee | |
| 2018/0277182 A1 | 9/2018 | Inaba | |
| 2019/0114144 A1 | 4/2019 | Lin et al. | |
| 2019/0369966 A1 | 12/2019 | Hsu | |
| 2019/0372456 A1 | 12/2019 | Ku et al. | |
| 2020/0058360 A1 | 2/2020 | Conte et al. | |
| 2021/0174871 A1* | 6/2021 | Chou | G11C 13/004 |
| 2022/0020442 A1* | 1/2022 | Ji | G11C 17/16 |
| 2022/0020443 A1* | 1/2022 | Ji | G11C 11/4074 |
| 2022/0311389 A1* | 9/2022 | Zhu | H03F 3/45188 |

FOREIGN PATENT DOCUMENTS

| | | |
|---|---|---|
| CN | 101916583 A | 12/2010 |
| CN | 103366790 A | 10/2013 |
| CN | 104217744 A | 12/2014 |
| CN | 104505123 A | 4/2015 |
| CN | 104505123 B | 4/2018 |
| CN | 108154894 A | 6/2018 |
| CN | 108288479 A | 7/2018 |
| CN | 108630265 A | 10/2018 |
| CN | 109671457 A | 4/2019 |
| CN | 109799374 A | 5/2019 |
| CN | 105913876 B | 10/2019 |
| CN | 110544500 A | 12/2019 |
| CN | 110838309 A | 2/2020 |
| CN | 210639992 U | 5/2020 |
| CN | 210925501 U | 7/2020 |
| JP | 2001319488 A | 11/2001 |

OTHER PUBLICATIONS

International Search Report in the international application No. PCT/CN2021/100976, dated Sep. 1, 2021, 2 pgs.
International Search Report in the international application No. PCT/CN2021/097918, dated Jul. 26, 2021, 2 pgs.
International Search Report in the international application No. PCT/CN2021/097849, dated Aug. 26, 2021, 2 pgs.

* cited by examiner

STATE DETECTION CIRCUIT FOR ANTI-FUSE MEMORY CELL, AND MEMORY

CROSS-REFERENCE TO RELATED APPLICATIONS

This application is a continuation of International Application No. PCT/CN2021/097849, filed on Jun. 2, 2021, which claims priority to Chinese Patent Application 202010687680.4, filed on Jul. 16, 2020. The disclosures of International Application No. PCT/CN2021/097849 and Chinese Patent Application 202010687680.4 are hereby incorporated by reference in their entireties.

TECHNICAL FIELD

The disclosure relates to the field of integrated circuit technologies, and exemplarily, relates to a state detection circuit for an anti-fuse memory cell and a memory including the circuit.

BACKGROUND

In a related art, a storage state of an anti-fuse memory cell is usually detected by a simple logic gate circuit. Referring to FIG. 1, the anti-fuse memory cell 11 that is connected with a FsBlin3 signal by a word line is taken as an example, if the anti-fuse memory cell is burned during programming, the anti-fuse memory cell is converted into a storage state from a non-storage state, and path resistance is reduced to a relatively small value (tens of kilohms to hundreds of kilohms). When the anti-fuse memory cell is selected, a path current flows through equivalent resistance under the storage state, and a relatively low voltage is generated at a node 1, so that an output signal D_out of a logic gate 12 is at a high level. Otherwise, if the anti-fuse memory cell is not burned during programming, equivalent resistance of the anti-fuse memory cell in the path will be relatively great (several megohms to hundreds of megohms), a voltage drop generated by a fixed circuit on the path will exceed a flipping point of the logic gate 12, so that the output signal D_out of the logic gate 12 is at a low level.

In actual production, the resistance of the anti-fuse memory cell under a non-storage state usually fluctuates in a wider scope, and when a process, a voltage, a temperature and other factors are changed, the flipping point of the logic gate circuit is changed in a wider scope. These factors may result in detection errors for the storage state of the anti-fuse memory cell. For example, a burned anti-fuse memory cell is misjudged as a non-burned anti-fuse memory cell, or a non-burned anti-fuse memory cell is misjudged as a burned anti-fuse memory cell, thereby declining a yield.

It is to be noted that information disclosed in the above background technology is only used to enhance the understanding of the background of the disclosure, and therefore may include information that does not constitute the related art known to those of ordinary skill in the art.

SUMMARY

The purpose of the disclosure is to provide a state detection circuit for an anti-fuse memory cell and a memory including the circuit, which are used for overcoming, at least to a certain extent, the inaccurate problem of the storage state detection result of the anti-fuse memory cell caused by the limitations and defects in the related art.

According to a first aspect of the disclosure, a state detection circuit for an anti-fuse memory cell is provided. The state detection circuit includes: an amplifier, which has a first input terminal connected with a first reference voltage, a second input terminal connected with a first node, and an output terminal connected with a second node; an anti-fuse memory cell array, which includes a plurality of anti-fuse memory cell sub-arrays, where bit lines of the plurality of anti-fuse memory cell sub-arrays are connected with the first node, and word lines of the plurality of anti-fuse memory cell sub-arrays are connected with a controller, and each of the anti-fuse memory cell sub-arrays includes a plurality of anti-fuse memory cells; a first switch element, which has a first terminal connected with a power supply, a second terminal connected with the first node, and a control terminal connected with the second node; a second switch element, which has a first terminal connected with the power supply, a second terminal connected with a third node, and a control terminal connected with the second node; a third switch element, which has a first terminal connected with the third node, a second terminal that is grounded, and a control terminal connected with the controller; and a comparator, which has a first input terminal connected with the third node, and a second input terminal connected with a second reference voltage.

According to a second aspect of the disclosure, a memory is provided, and the memory includes a state detection circuit for an anti-fuse memory cell. The state detection circuit includes: an amplifier, which has a first input terminal connected with a first reference voltage, a second input terminal connected with a first node, and an output terminal connected with a second node; an anti-fuse memory cell array, which includes a plurality of anti-fuse memory cell sub-arrays, where bit lines of the plurality of anti-fuse memory cell sub-arrays are connected with the first node, and word lines of the plurality of anti-fuse memory cell sub-arrays are connected with a controller, and each of the anti-fuse memory cell sub-arrays includes a plurality of anti-fuse memory cells; a first switch element, which has a first terminal connected with a power supply, a second terminal connected with the first node, and a control terminal connected with the second node; a second switch element, which has a first terminal connected with the power supply, a second terminal connected with a third node, and a control terminal connected with the second node; a third switch element, which has a first terminal connected with the third node, a second terminal that is grounded, and a control terminal connected with the controller; and a comparator, which has a first input terminal connected with the third node, and a second input terminal connected with a second reference voltage.

It is to be understood that general description above and the detailed description below are only illustrative and explanatory and do not restrict the disclosure.

BRIEF DESCRIPTION OF THE DRAWINGS

The drawings herein are incorporated into the specification and constitute part of this specification, show the embodiment conforming to the disclosure, and are used together with the specification to explain the principles of the disclosure. It is apparent that the drawings described below merely illustrate some embodiments of the embodiments of the disclosure. Those ordinarily skilled in the art can obtain other accompanying drawings without creative labor on the basis of those accompanying drawings.

DETAILED DESCRIPTION

Figure 1:
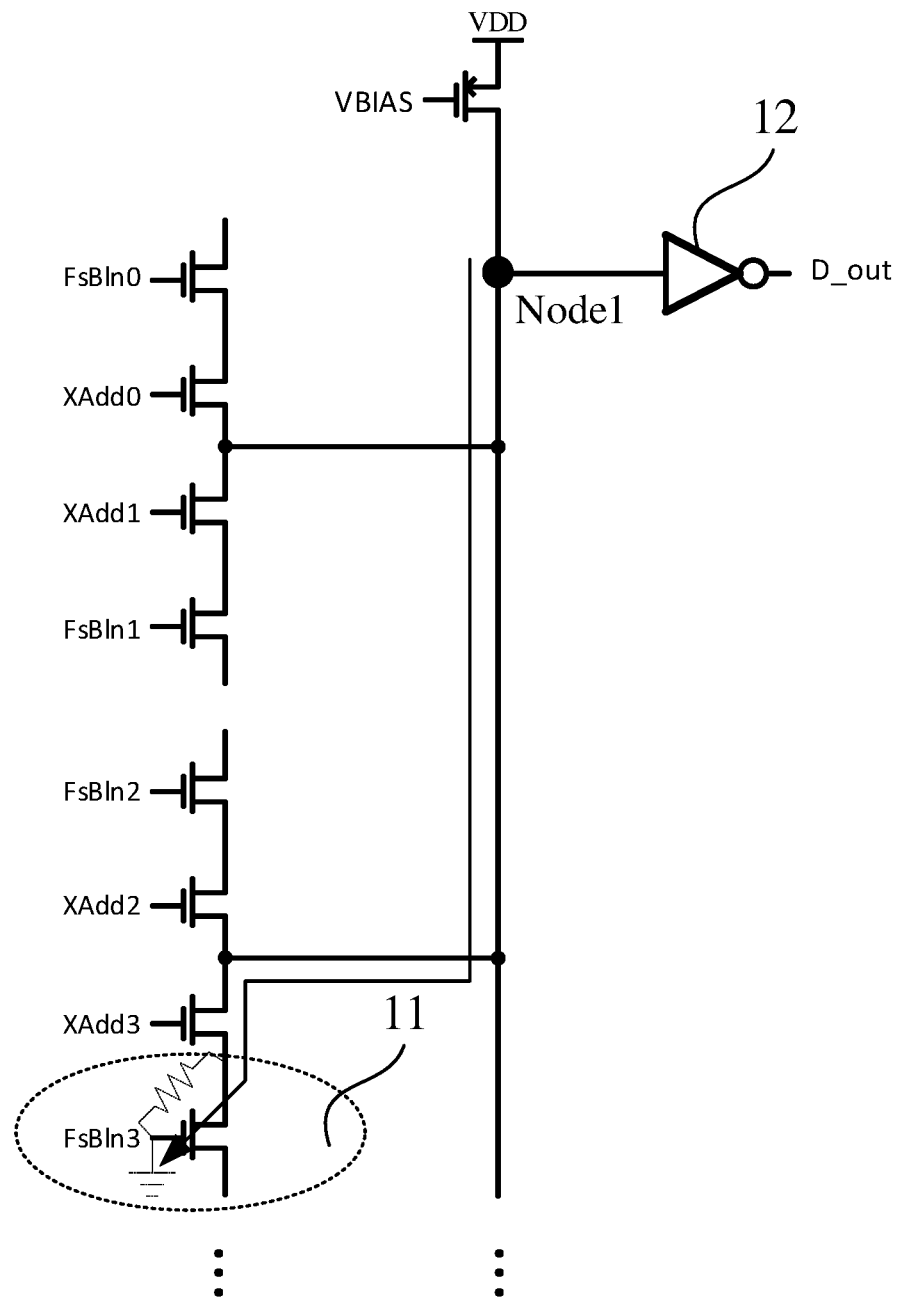
FIG. 1 is a schematic diagram of a state detection circuit for an anti-fuse memory cell in a related art.

The following completely describes the exemplary implementation modes with reference to the drawings. However, the exemplary implementation mode can be implemented in various forms and should not be understood to be limited to the examples described herein. On the contrary, the provision of these implementation modes makes the disclosure more comprehensive and complete and fully communicates the idea of the exemplary implementation modes to those skilled in the art. The described features, structures, or characteristics may be combined in one or more implementation modes in any appropriate manner. In the following description, many specific details are provided to give a full understanding of implementation modes of this disclosure. However, those skilled in the art will be aware that the technical solution in the disclosure may be practiced without one or more of the specific details, or that other methods, components, devices, steps and the like may be adopted. In other cases, the technical solutions of the disclosure are not presented or described in detail to avoid obfuscating all aspects of the disclosure.

In addition, the drawings are only schematic diagrams of the disclosure. The same drawing marks in the drawing indicate the same or similar part, so their repeated description will be omitted. Some of the block diagrams shown in the drawings are functional entities, and do not necessarily correspond to physically or logically independent entities. These functional entities may be implemented in software form, or in one or more hardware modules or integrated circuits, or in different network and/or processor devices and/or microcontroller devices.

The exemplary implementation modes of the disclosure are described in detail in combination with the drawings.

Figure 2:
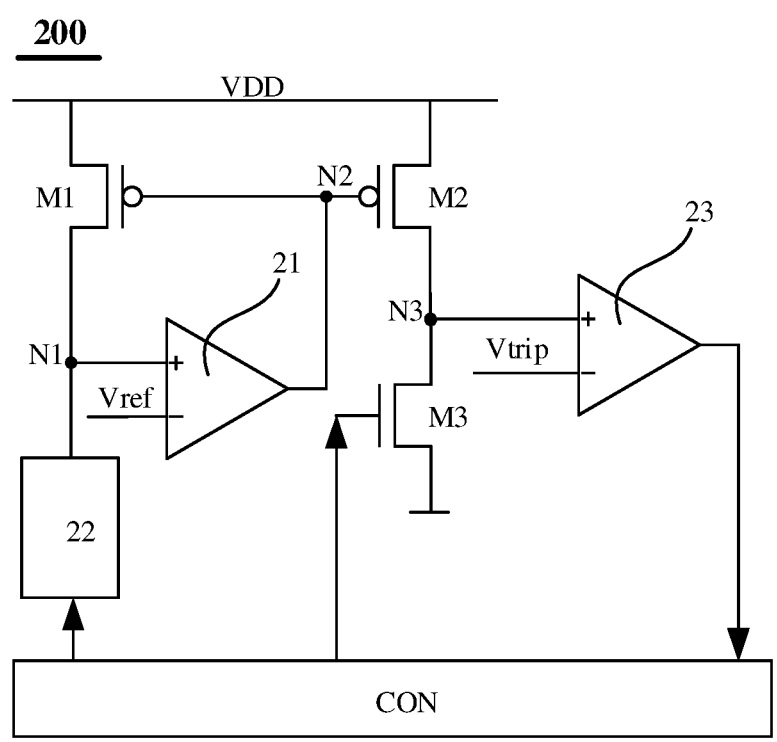
FIG. 2 is a structural schematic diagram of a state detection circuit for an anti-fuse memory cell according to an exemplary embodiment of the disclosure.

FIG. 2 is a structural schematic diagram of a state detection circuit for an anti-fuse memory cell according to an exemplary embodiment of the disclosure.

Referring to FIG. 2, the state detection circuit 200 for the anti-fuse memory cell may include an amplifier 21, an anti-fuse memory cell array 22, a first switch element M1, a second switch element M2, a third switch element M3 and a comparator 23.

A first input terminal of the amplifier 21 is connected with a first reference voltage Vref, a second input terminal of the amplifier 21 is connected with a first node N1, and an output terminal of the amplifier 21 is connected with a second node N2.

The anti-fuse memory cell array 22 includes a plurality of anti-fuse memory cell sub-arrays, where bit lines of the plurality of anti-fuse memory cell sub-arrays are connected with the first node N1, word lines of the plurality of anti-fuse memory cell sub-arrays are connected with a controller CON, and each of the anti-fuse memory cell sub-arrays includes a plurality of anti-fuse memory cells.

A first terminal of the first switch element M1 is connected with a power supply VDD, a second terminal of the first switch element M1 is connected with the first node N1, and a control terminal of the first switch element M1 is connected with the second node N2.

A first terminal of the second switch element M2 is connected with the power supply VDD, a second terminal of the second switch element M2 is connected with the third node N3, and a control terminal of the second switch element M2 is connected with the second node N2.

A first terminal of the third switch element M3 is connected with the third node N3, a second terminal of the third switch element M3 is grounded, and a control terminal of the third switch element M3 is connected with the controller CON.

A first input terminal of the comparator 23 is connected with the third node N3, and the second input terminal of the comparator 23 is connected with a second reference voltage Vtrip.

Figure 11:
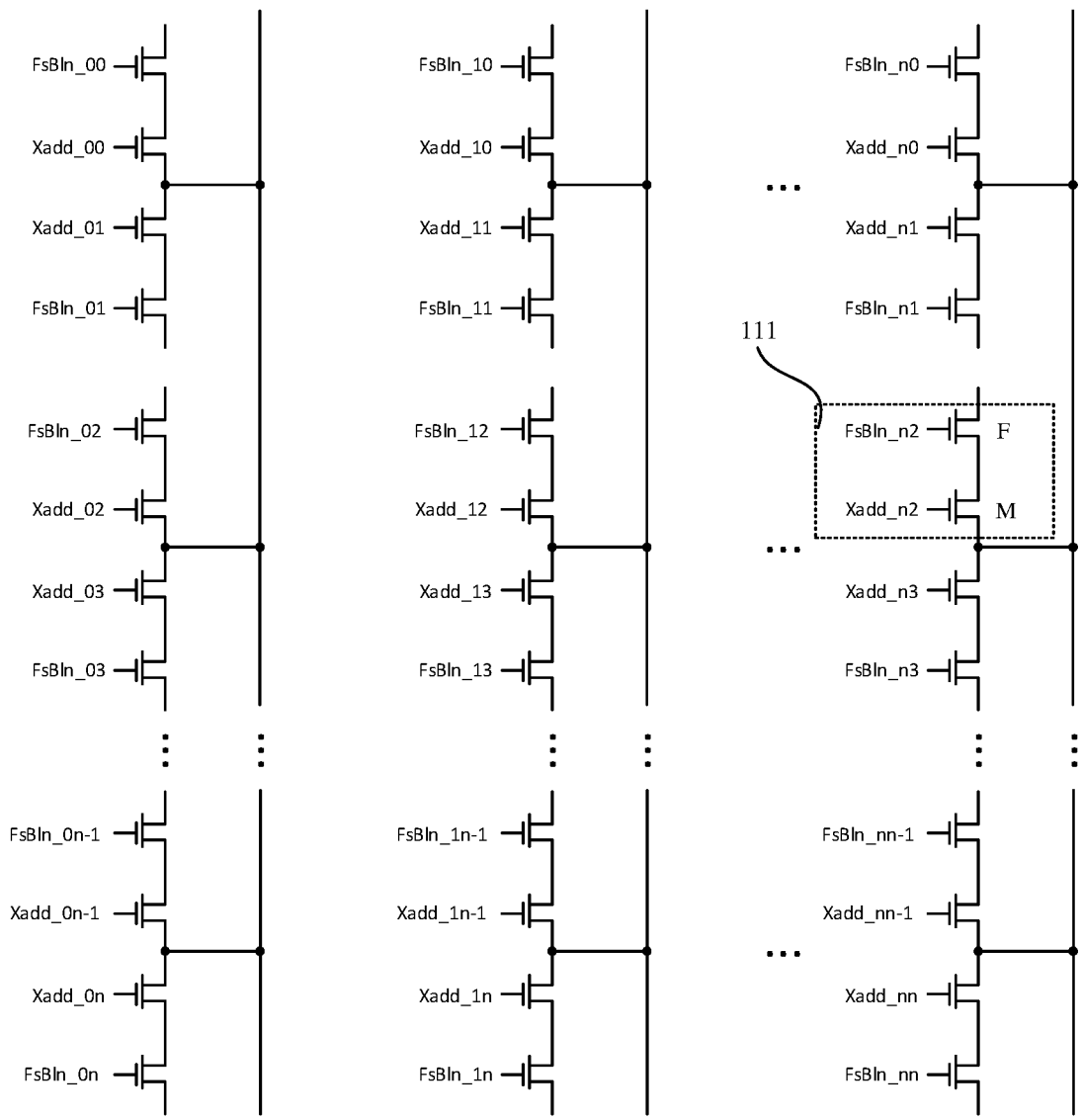
FIG. 11 is a structural schematic diagram of an anti-fuse memory cell according to an embodiment of the disclosure.

Reference is made to FIG. 11 for the structures of the anti-fuse memory cell array 22 and the anti-fuse memory cell as shown in FIG. 2, which illustrates three anti-fuse memory cell sub-arrays corresponding to three bit lines. Each anti-fuse memory cell sub-array includes a plurality of anti-fuse memory cells 111, and each anti-fuse memory cell 111 includes one selection switch element M and one anti-fuse element F.

In an embodiment, the first switch element M1 and the second switch element M2 are P-type transistors, the first input terminal of the amplifier 21 is a non-inverting input terminal, and the second input terminal is an inverting input terminal. In another embodiment, the first switch element M1 and the second switch element M2 are N-type transistors, the first input terminal of the amplifier 21 is an inverting input terminal, and the second input terminal is a non-inverting input terminal. Those skilled in the art may determine the connection manner of the amplifier by themselves according to the arrangement of the first switch element M1 and the second switch element M2, and limitations are not made in the disclosure.

It can be understood that a default state of the third switch element is a turned on state, so that a voltage of the third node N3 is maintained to be zero before the voltage through the comparator 23 is detected.

The controller CON not only includes a control logic circuit for the selection switch element M in the anti-fuse memory cell, but also includes a processing logic circuit for further processing the output result of the comparator 23. For example, in FIG. 11, the control logic circuit makes Xadd_00 to Xadd_nn valid one by one, so that the states of the anti-fuse elements F_00 to F_nn are detected one by one, while the processing logic circuit makes use of the states F_00 to F_nn to perform redundant replacements and other operations.

Figure 3:
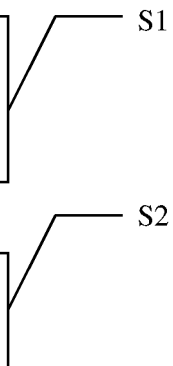
FIG. 3 is a flowchart of a detection method by a controller (CON) applied to a circuit as shown in FIG. 2.

FIG. 3 is a flowchart of a detection method by a controller (CON) applied to a circuit as shown in FIG. 2.

Referring to FIG. 3, the controller CON may be configured to implement the detection method 300, which may include the following operations.

At S1, a first control signal is output at the first time point to detect a storage state of the anti-fuse memory cell, and a second control signal is output to control the third switch element to be turned off.

At S2, an output signal of the comparator is obtained at a second time point to determine the storage state of the anti-fuse memory cell.

Herein, the second time point is later than the first time point.

Figure 4:
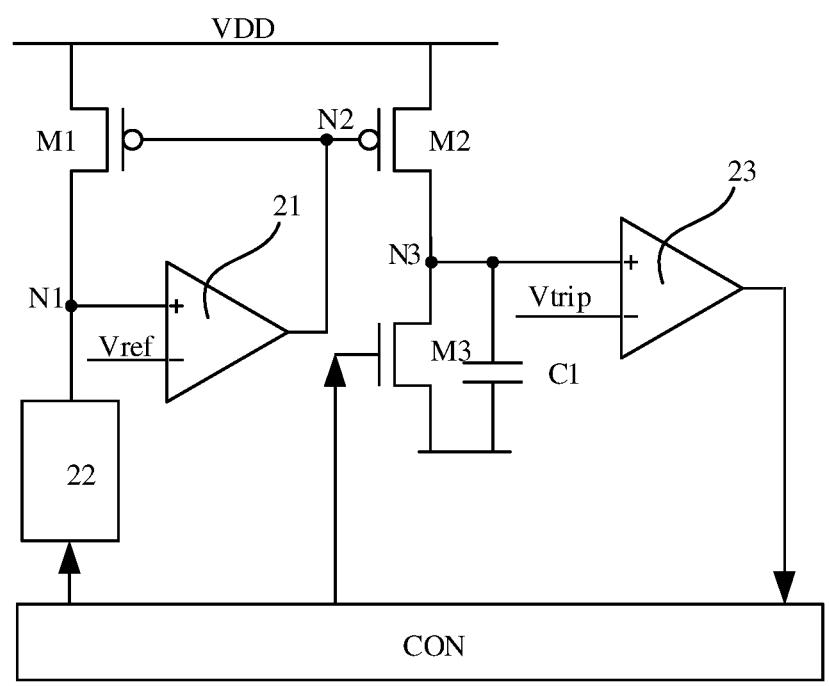
FIG. 4 is a schematic diagram of an equivalent circuit of a circuit as shown in FIG. 2.

FIG. 4 is a schematic diagram of an equivalent circuit of a circuit as shown in FIG. 2. The control method in FIG. 3 is described in combination with FIG. 2-FIG. 4.

Referring to FIG. 4, in this embodiment of the disclosure, a resistance of the anti-fuse memory cell to be detected is converted to a linear current source by using the amplifier 21, the first switch element M1 and the second switch element M2 so as to charge the third node, so that the detection for the resistance (namely, the storage state) of the anti-fuse memory cell to be detected can be realized by detecting and comparing the electric potential of the third node.

In an embodiment, the voltage of the third node N3 may be detected by using the parasitic capacitor C1 of the third node N3.

After the anti-fuse memory cell to be detected is selected at the first time point through a first control signal, a resistance of the path where the first node N1 is located is changed, and the voltage of the first node N1 is declined. A drain source voltage of the first switch element M1 is changed, a first current is generated through a feedback circuit of the amplifier 21, and the first current is negatively correlated with the resistance of the anti-fuse memory cell to be detected. The generation of the first current will change the voltage of the second node N2 where a gate of the first switch element M1 is located. When the second switch element M2 is controlled to work at a saturated state, a second current flowing through the second switch element M2 and the third node N3 is negatively correlated with the voltage of the second node N2 where the gate of the second switch element M2 is located. Namely, the second current is negatively correlated with the resistance of the anti-fuse memory cell to be detected, and the greater the resistance of the anti-fuse memory cell to be detected, the smaller the second current. The smaller the resistance of the anti-fuse memory cell to be detected, the greater the second current.

After the second control signal is output to control the third switch element M3 to be turned off, the second current charges the third node N3 through the parasitic capacitor, and the voltage of the third node N3 is finally lifted from zero to the power supply VDD. The greater the second current, the shorter a charging time of the third node N3, and the quicker a voltage change speed of the third node N3; the smaller the second current, the longer the charging time of the third node N3, and the slower the voltage change speed of the third node N3. It can be known from the above analysis that the greater the resistance of the anti-fuse memory cell to be detected, the smaller the second current and the slower the voltage change speed of the third node N3; and the smaller the resistance of the anti-fuse memory cell to be detected, the greater the second current and the quicker the voltage change speed of the third node N3.

The voltage of the third node N3 is compared by the comparator 23 with a suitable second reference voltage Vtrip at a suitable second time point, so that the resistance of the anti-fuse memory cell to be detected can be determined, namely, the storage state of the anti-fuse memory cell to be detected can be determined.

The method for obtaining the output signal of the comparator 23 can be setting the comparator 23 to be at an enabled state and reading the output signal of the comparator 23 at the second time point, and can also be controlling the comparator 23 to be converted to the enabled state at the second time point through an enable pin of the comparator 23 and reading the output signal of the comparator 23, where a comparison result of the voltage of the third node N3 and the second reference voltage Vtrip is output by the output signal.

Detection is performed at the suitable time point by adopting the suitable second reference voltage and the comparator, so that the flipping point of the comparator may be accurately controlled, and it is thus possible to prevent the detection error of the storage state caused by the resistance offset or the offset of the flipping point of the logic gate itself. Therefore, in the embodiments of the disclosure, the selection of the second time point and the setting of the voltage value of the second reference voltage Vtrip are the important means for implementing the accurate detection.

Figure 5:
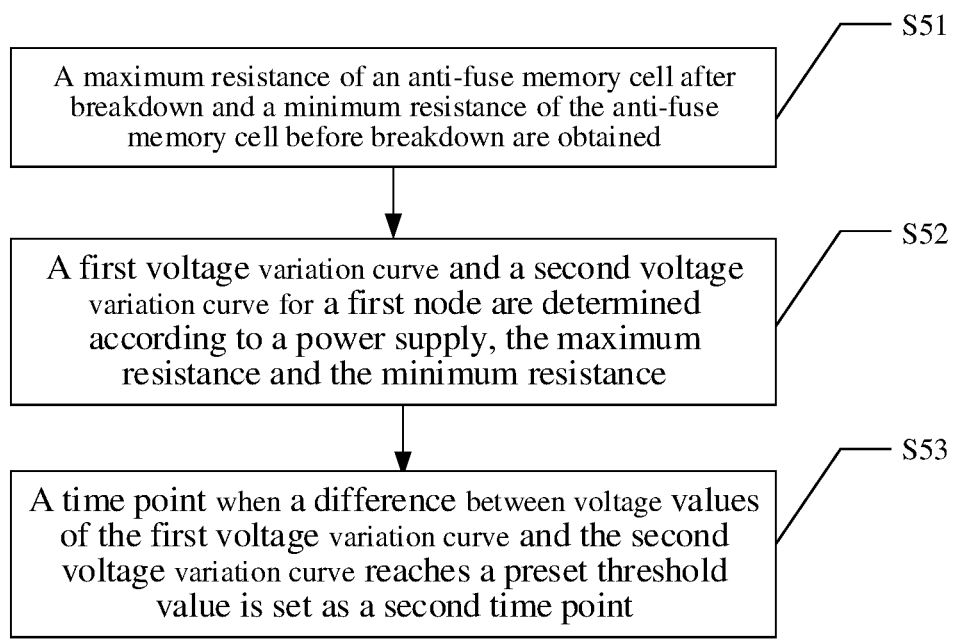
FIG. 5 is a schematic diagram of a manner for determining a second time point according to an embodiment of the disclosure.

FIG. 5 is a schematic diagram of a manner for determining a second time point according to an embodiment of the disclosure.

Referring to FIG. 5, in an exemplary embodiment of the disclosure, the second time point may be determined according to the following operations S51 to S53.

At S51, a maximum resistance of the anti-fuse memory cell after breakdown and a minimum resistance of the anti-fuse memory cell before breakdown are obtained.

At S52, a first voltage variation curve and a second voltage variation curve for the first node are determined according to the power supply, the maximum resistance and the minimum resistance.

At S53, a time point when a difference between voltage values of the first voltage variation curve and the second voltage variation curve reaches a preset threshold value is set as the second time point.

In the embodiments of the disclosure, a difference between the second time point T2 and the first time point T1 is related to the difference between voltage values of the first voltage variation curve and the second voltage variation curve.

Figure 6:
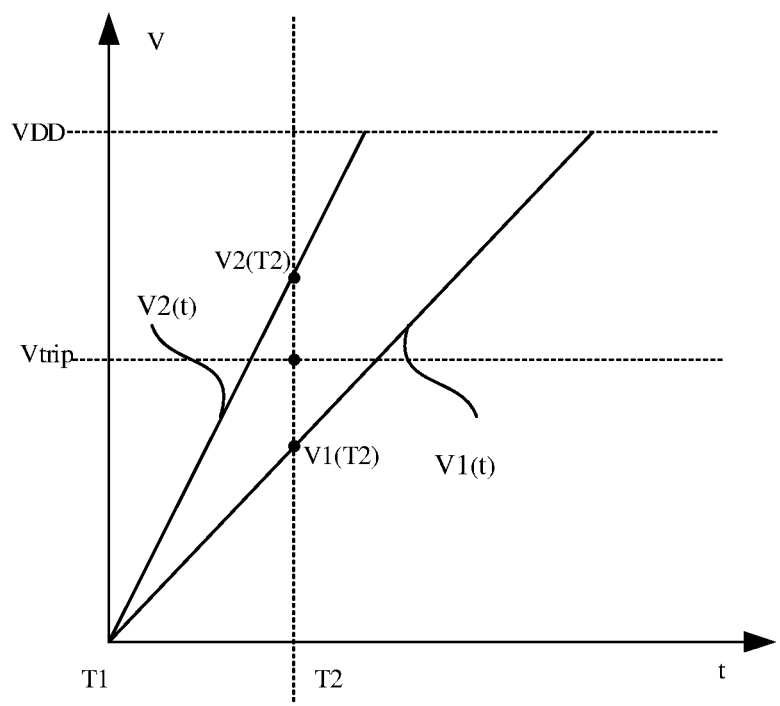
FIG. 6 is a schematic diagram of a first voltage variation curve and a second voltage variation curve.

FIG. 6 is a schematic diagram of a first voltage variation curve and a second voltage variation curve.

The minimum resistance of the anti-fuse memory cell before breakdown is set as R1, the maximum resistance of the anti-fuse memory cell after breakdown is set as R2, R1 may be obtained by detecting the resistances of the plurality of anti-fuse memory cells before breakdown, and R2 may be obtained by detecting the resistances of the plurality of anti-fuse memory cells after breakdown. The abovementioned R1 and R2 are statistical results. The R1 and R2 are obtained through statistical analysis during the research, development and production process of the anti-fuse memory cell, so as to determine the specific values of the R1 and R2.

Referring to FIG. 6, when the path resistance includes R1, the first voltage variation curve of the voltage $V1(t)$ of the third node N3 rising from 0 to VDD over a time period starting at the first time point T1 is:

$$V1(t) = I_1(t) * t/C1 \quad (1).$$

Herein, $I_1(t)$ is the second current when the path resistance includes R1, and it is assumed that the equivalent capacitance of the third node N3 is about C1.

When the path resistance includes R2, the second voltage variation curve of the voltage $V2(t)$ of the third node N3 rising from 0 to VDD over a time period starting at the first time point T1 is:

$$V2(t) = I_2(t) * t/C1 \quad (2).$$

Herein, $I_2(t)$ is the second current when the path resistance includes R2.

It can be known from formula (1) and formula (2) that $V2(t)$ is greater than $V1(t)$, and the difference $\Delta V(t)$ between voltage values of the first voltage variation curve and the second voltage variation curve is:

$$\Delta V(t) = V2(t) - V1(t) = (I_2(t) - I_1(t)) * t/C1 \quad (3).$$

A time point when $\Delta V(t)$ is equal to a preset threshold value is determined as the second time point. The preset threshold value may be determined according to a parameter of the comparator 23, for example, greater than twice of the differential input voltage threshold value of the comparator 23. The greater the preset threshold value, the higher the detection accuracy; and the smaller the preset threshold value, the shorter the detection time. Therefore, those skilled in the art may adjust the setting value of the preset threshold value by themselves according to actual conditions, so as to implement a solution that is optimal for both the detection accuracy and the detection time.

It can be understood that, at the beginning of the detection, the voltage of the third node N3 may be controlled to be zero through a plurality of manners, to facilitate accurate detection.

In an exemplary embodiment of the disclosure, the reference voltage Vtrip may be determined according to the curves as shown in FIG. 6. The first voltage V1(T2) of the first voltage variation curve V1(t) at the second time point T2 and the second voltage V2(T2) of the second voltage variation curve V2(t) at the second time point T2 may be firstly determined, and then an average value of the first voltage value V1(T2) and the second voltage value V2(T2) is set as the reference voltage Vtrip, namely:

$$Vtrip = \frac{V1(T2) + V2(T2)}{2}. \quad (4)$$

The second time point is calculated through the above manner and the reference voltage Vtrip used for controlling the comparator flipping point is determined according to the second time point. In this way, more accurate detection result may be obtained when the output signal of the comparator is detected, thereby effectively improving the detection accuracy.

Figure 7:
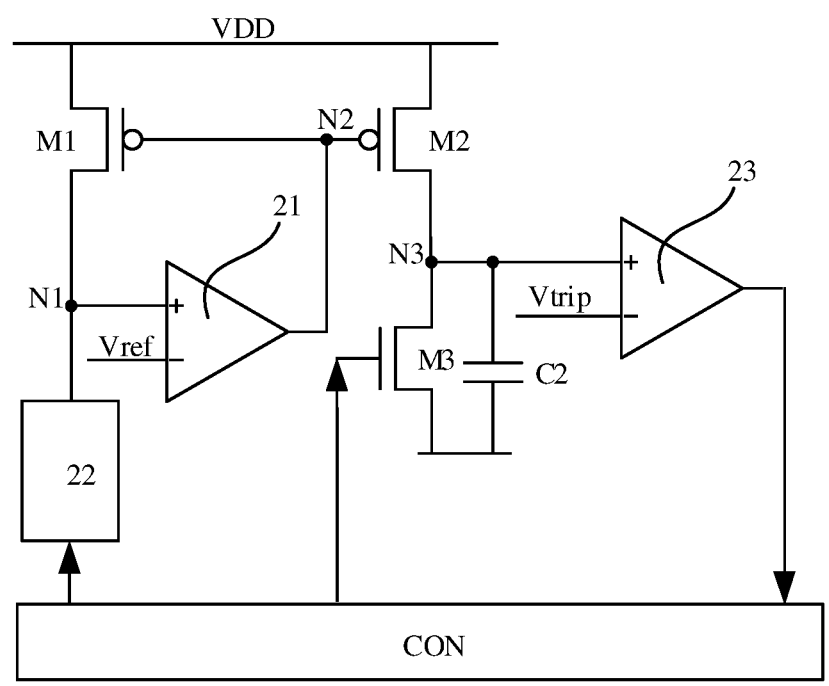
FIG. 7 is a structural schematic diagram of a state detection circuit for an anti-fuse memory cell according to another embodiment of the disclosure.

FIG. 7 is a structural schematic diagram of a state detection circuit for an anti-fuse memory cell according to another embodiment of the disclosure.

Referring to FIG. 7, in order to reduce a random deviation of a discharging wire caused by a deviation of the parasitic capacitance of the third node N3, an extra capacitor C2 may be added to the third node N3. Namely, the state detection circuit 200 may also include a detection capacitor C2.

A first terminal of the detection capacitor C2 is connected with the third node N3, and a second terminal of the detection capacitor C2 is grounded.

The function of the detection capacitor C2 is the same as that of the parasitic capacitor C1, both are to detect the voltage of the third node N3. When a difference between a capacitance of the detection capacitor C2 and a capacitance of the parasitic capacitor C1 is relatively great, the equivalent capacitance at the third node N3 may be regarded as the capacitance of the detection capacitor C2, then C1 involved in the formulas (1)-(4) may be replaced by C2.

Figure 8:
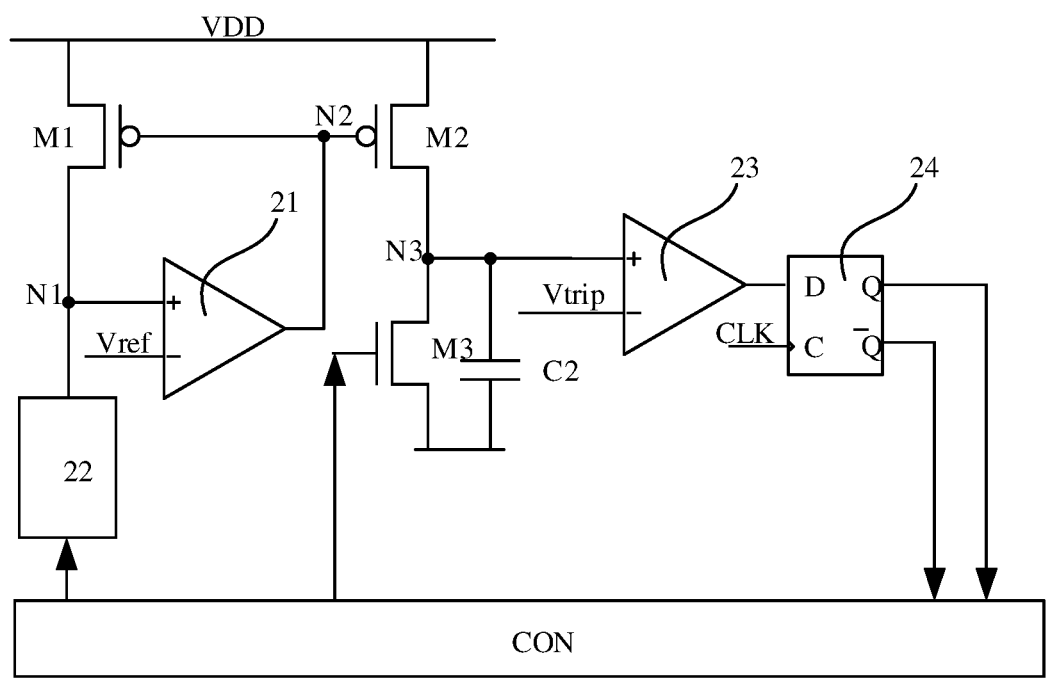
FIG. 8 is a structural schematic diagram of a state detection circuit for an anti-fuse memory cell according to yet another embodiment of the disclosure.

FIG. 8 is a structural schematic diagram of a state detection circuit for an anti-fuse memory cell according to yet another embodiment of the disclosure.

Referring to FIG. 8, in other embodiments of the disclosure, the state detection circuit 200 may also include a trigger 24.

An input terminal of the trigger 24 is connected with the output terminal of the comparator 23, and a first output terminal and a second output terminal of the trigger 24 are both connected with the controller CON.

The trigger 24 may be, for example, a D trigger, which is configured to latch the output signal of the comparator 23 so that the output signal is conveniently read by the controller CON. Those skilled in the art may set the model of the trigger 24 by themselves, and limitations are not made in the disclosure.

It can be understood that the arrangement of the detection capacitor C2 or the trigger 24 does not affect the implementation of the control method as shown in FIG. 3 and does not affect the selection of the second time point and the second reference voltage.

Figure 9:
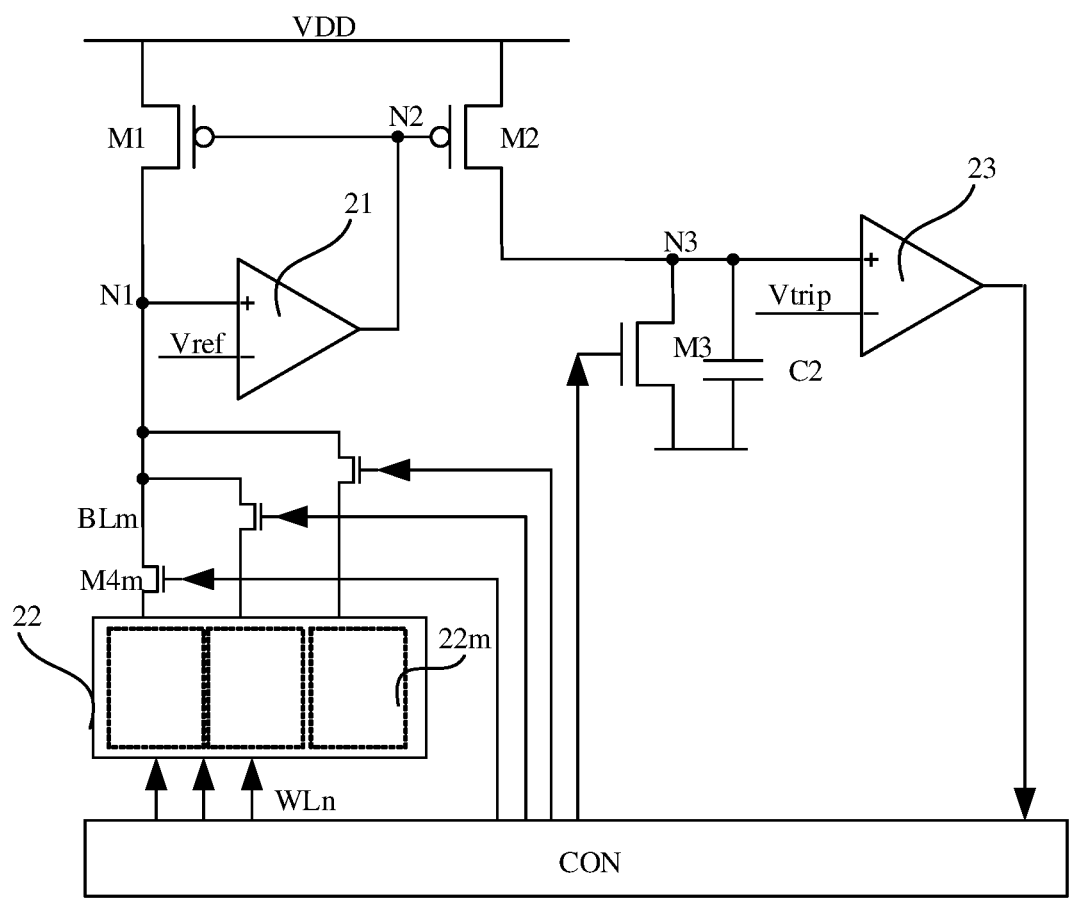
FIG. 9 is a structural schematic diagram of a state detection circuit for an anti-fuse memory cell according to yet another embodiment of the disclosure.

FIG. 9 is a structural schematic diagram of a state detection circuit for an anti-fuse memory cell according to yet another embodiment of the disclosure.

Referring to FIG. 9, in an embodiment, the third node N3 may be configured to connect to a plurality of bit lines, and the anti-fuse memory cell array 22 may include a plurality of anti-fuse memory cell sub-arrays 22m (m is the serial number of the bit line), and a plurality of fourth switch elements M4m.

Each of the anti-fuse memory cell sub-arrays 22m corresponds to one bit line BLm, and each of the anti-fuse memory cell sub-arrays 22m includes a plurality of anti-fuse memory cells.

The plurality of fourth switch elements M4m correspond to the anti-fuse memory cell sub-arrays 22m, a first terminal of each fourth switch element M4m is connected with the bit line BLm of the corresponding anti-fuse memory cell sub-array 22m, a second terminal of each fourth switch element M4m is connected with the third node N3, a control terminal of each fourth switch element M4m is connected with the controller CON, and the default state of the fourth switch element M4m is a turned off state.

Herein, each of the anti-fuse memory cell sub-arrays 22m may include, for example, 16 anti-fuse memory cells connected with one bit line, namely, a column of anti-fuse memory cells. In some embodiments, one bit line corresponds to one first switch element M1, one second switch element M2, one amplifier 21 and one comparator 23.

Figure 10:
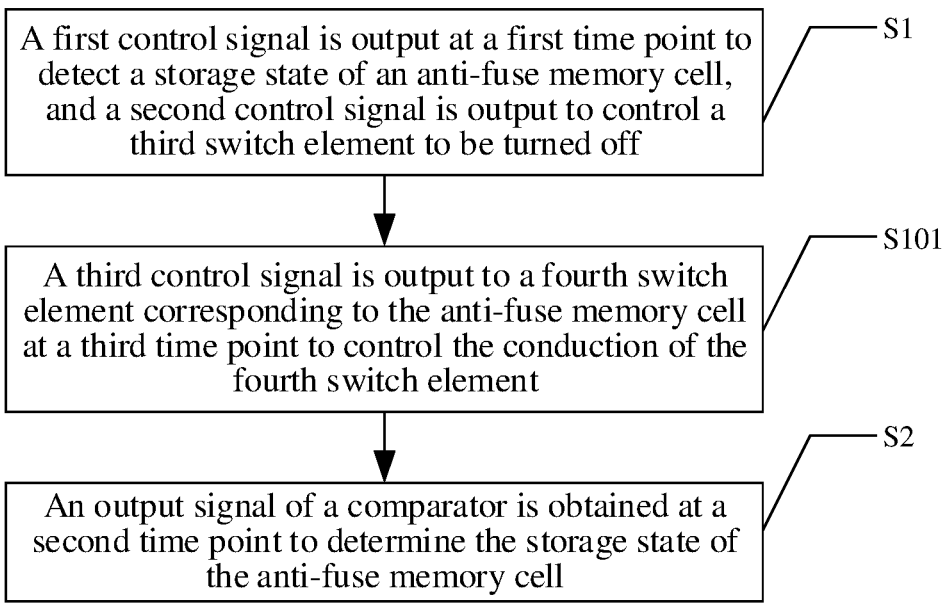
FIG. 10 is a flowchart of a detection method corresponding to a circuit as shown in FIG. 9.

By connecting the plurality of anti-fuse memory cell sub-arrays 22m to the first node, it is possible to realize the detection for the storage state of the anti-fuse memory cells in the plurality of anti-fuse memory cell sub-arrays 22m, and the exemplary manner is as shown in FIG. 10.

FIG. 10 is a flowchart of a detection method corresponding to a circuit as shown in FIG. 9.

Referring to FIG. 10, in the circuit as shown in FIG. 9, the controller CON may be configured to implement the following operations.

At S1, a first control signal is output at the first time point to detect the storage state of the anti-fuse memory cell, and a second control signal is output to control the third switch element to be turned off.

At S101, a third control signal is output to the fourth switch element corresponding to the anti-fuse memory cell at a third time point to control the fourth switch element to be turned on.

At S2, an output signal of the comparator is obtained at the second time point to determine the storage state of the anti-fuse memory cell.

Herein, the first time point and the third time point are earlier than the second time point.

Namely, the method as shown in FIG. 3 further includes S101, and the S101 and S1 may be reversed.

In the embodiment as shown in FIG. 10, the third time point may be earlier than the first time point, or later than the first time point, or equal to the first time point, as long as the third time point and the first time point are earlier than the second time point so that a discharging path is formed before the voltage of the third node N3 is detected at the second time point.

When the fourth switch element is the P-type transistor, the third control signal is at the low level. When the fourth switch element is N-type transistor, the third control signal is at the high level. When the fourth switch element is one of the other types of elements, the third control signal may be any other type of signal, and specific limitations are not made herein.

FIG. 11 is a schematic diagram of an anti-fuse memory cell according to an embodiment of the disclosure.

Referring to FIG. 11, the anti-fuse memory cell 111 may include a selection switch element M and an anti-fuse element F.

A first terminal of the selection switch element M is used as a bit line of the anti-fuse memory cell 111.

A first terminal of the anti-fuse element F is connected with a second terminal of the selection switch element M.

Herein, the control terminal of the selection switch element M and the control terminal of the anti-fuse element F are connected with the controller.

Figure 12:
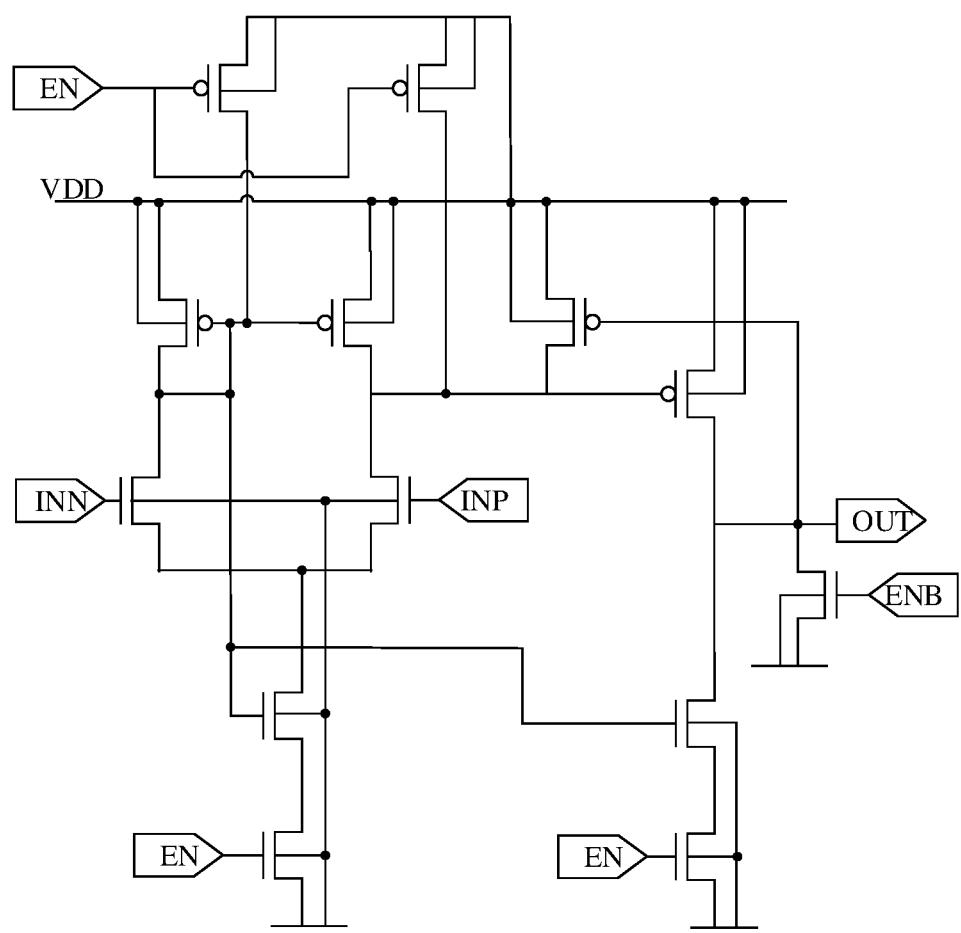
FIG. 12 is a schematic diagram of a comparator according to an embodiment of the disclosure.

FIG. 12 is a schematic diagram of a comparator 23 according to an embodiment of the disclosure.

Referring to FIG. 12, in an embodiment, a differential amplifier may be configured to implement the functions of the comparator 23, and a self-biased circuit is used in the comparator 23. The differential amplifier adopts a simple two-stage comparator so as to accurately control the flipping point, and excessive bias current wirings may be avoided by the self-biased circuit.

According to the state detection circuit for the anti-fuse memory cell and the state detection method for an anti-fuse memory cell provided by the embodiments of the disclosure, the third node N3 is charged by a constant-current source constructed by the amplifier, the first switch element, the second switch element and the resistance of the anti-fuse memory cell to be detected at the first time point, the voltage of the third node is detected at the second time point, and the voltage of the third node is compared by the comparator with the second reference voltage, so as to accurately control the output flipping point of the comparator. The second time point when the state detection is most accurate may be determined by: calculating the minimum resistance R1 of the anti-fuse memory cell before breakdown and the maximum resistance R2 after breakdown, and determining the time point corresponding to the maximum difference between voltage values of the voltage variation curves at the third node for R1 and R2. The average value of the values of the two voltage variation curves at the second time point is used as the reference voltage, so that the output of the comparator is more accurate, and it is thus possible to avoid the misjudgment for the storage state of the anti-fuse memory cell caused by the resistance offset of the anti-fuse memory cell and the flipping voltage offset of the logic gate in the related art.

According to one aspect of the disclosure, a memory is provided, and the memory includes any one state detection circuit for an anti-fuse memory cell described above. The memory may be, for example a Dynamic Random Access Memory (DRAM).

It is to be noted that although multiple modules or units of a device used for action execution are mentioned in details above, this division is not mandatory. Actually, according to the implementation mode of the disclosure, the features and functions of two or more modules or units described above may be embodied in one module or unit. Otherwise, the features and functions of one module or unit described above may be further divided into multiple modules or units for embodying.

After considering the description and practice of the invention of the disclosure herein, those skilled in the art can think of other embodiments of the disclosure easily. This application is intended to cover any variation, use, or adaptation change of the disclosure. These variation, use, or adaptation change follow the general principles of the disclosure and include the common knowledge or customary technical means in the art of the undisclosed embodiments. The descriptions and embodiments are considered to be exemplary only, and the true scope and spirit of the disclosure are indicated by the claims.

INDUSTRIAL APPLICABILITY

In the embodiments of the disclosure, the resistance of the anti-fuse memory cell to be detected is converted to a linear current source by using the amplifier, the first switch element and the second switch element, so as to charge the third node. The voltage of the third node is compared with the second reference voltage at the second time point to obtain the resistance value of a current anti-fuse memory cell to be detected in the anti-fuse memory cell array, so that the voltage flipping point used for detecting the storage state of the anti-fuse memory cell may be precisely controlled, and it is thus possible to avoid misjudgment for the storage state of the anti-fuse memory cell in the related art caused by the resistance offset of the anti-fuse memory cell and the flipping voltage offset of the logic gate.

The invention claimed is:

1. A state detection circuit for an anti-fuse memory cell, comprising
an amplifier, which has a first input terminal connected with a first reference voltage, a second input terminal connected with a first node, and an output terminal connected with a second node;
an anti-fuse memory cell array, which comprises a plurality of anti-fuse memory cell sub-arrays, wherein bit lines of the plurality of anti-fuse memory cell sub-arrays are connected with the first node, and word lines of the plurality of anti-fuse memory cell sub-arrays are connected with a controller, and each of the anti-fuse memory cell sub-arrays comprises a plurality of anti-fuse memory cells;

a first switch element, which has a first terminal connected with a power supply, a second terminal connected with the first node, and a control terminal connected with the second node;

a second switch element, which has a first terminal connected with the power supply, a second terminal connected with a third node, and a control terminal connected with the second node;

a third switch element, which has a first terminal connected with the third node, a second terminal that is grounded, and a control terminal connected with the controller; and a comparator, which has a first input terminal connected with the third node, and a second input terminal connected with a second reference voltage.

2. The state detection circuit for an anti-fuse memory cell of claim 1, wherein the controller is configured to:

output a first control signal at a first time point to detect a storage state of the anti-fuse memory cell, and output a second control signal to control the third switch element to be turned off; and obtain an output signal of the comparator at a second time point to determine the storage state of the anti-fuse memory cell, wherein the second time point is later than the first time point.

3. The state detection circuit for an anti-fuse memory cell of claim 2, wherein the second time point is determined by:

obtaining a maximum resistance of the anti-fuse memory cell after breakdown and a minimum resistance of the anti-fuse memory cell before breakdown;

determining a first voltage variation curve and a second voltage variation curve for the first node according to the power supply, the maximum resistance and the minimum resistance; and setting, as the second time point, a time point when a difference between voltage values of the first voltage variation curve and the second voltage variation curve reaches a preset threshold value.

4. The state detection circuit for an anti-fuse memory cell of claim 3, wherein the second reference voltage is determined by:

determining a first voltage value of the first voltage variation curve at the second time point and a second voltage value of the second voltage variation curve at the second time point; and setting an average value of the first voltage value and the second voltage value as the second reference voltage.

5. The state detection circuit for an anti-fuse memory cell of claim 1, further comprising:

a detection capacitor, which has a first terminal connected with the third node and a second terminal that is grounded.

6. The state detection circuit for an anti-fuse memory cell of claim 1, further comprising:

a trigger, which has an input terminal connected with an output terminal of the comparator, and a first output terminal and a second output terminal both connected with the controller.

7. The state detection circuit for an anti-fuse memory cell of claim 1, wherein the anti-fuse memory cell comprises:

a selection switch element, which has a first terminal used as the bit line of the anti-fuse memory cell; and an anti-fuse element, which has a first terminal connected with a second terminal of the selection switch element, wherein a control terminal of the selection switch element and a control terminal of the anti-fuse element are connected with the controller.

8. The state detection circuit for an anti-fuse memory cell of claim 1, wherein the first switch element and the second switch element are P-type transistors, the first input terminal of the amplifier is a non-inverting input terminal, and the second input terminal is an inverting input terminal; or, the first switch element and the second switch element are N-type transistors, the first input terminal of the amplifier is an inverting input terminal, and the second input terminal is a non-inverting input terminal.

9. The state detection circuit for an anti-fuse memory cell of claim 2, wherein obtaining the output signal of the comparator comprises:

controlling the comparator to be at an enabled state at the second time point so as to read the output signal of the comparator.

10. A memory, comprising a state detection circuit for an anti-fuse memory cell, wherein the state detection circuit comprises:

an amplifier, which has a first input terminal connected with a first reference voltage, a second input terminal connected with a first node, and an output terminal connected with a second node;

an anti-fuse memory cell array, which comprises a plurality of anti-fuse memory cell sub-arrays, wherein bit lines of the plurality of anti-fuse memory cell sub-arrays are connected with the first node, and word lines of the plurality of anti-fuse memory cell sub-arrays are connected with a controller, and each of the anti-fuse memory cell sub-arrays comprises a plurality of anti-fuse memory cells;

a first switch element, which has a first terminal connected with a power supply, a second terminal connected with the first node, and a control terminal connected with the second node;

a second switch element, which has a first terminal connected with the power supply, a second terminal connected with a third node, and a control terminal connected with the second node;

a third switch element, which has a first terminal connected with the third node, a second terminal that is grounded, and a control terminal connected with the controller; and a comparator, which has a first input terminal connected with the third node, and a second input terminal connected with a second reference voltage.

11. The memory of claim 10, wherein the controller is configured to:

output a first control signal at a first time point to detect a storage state of the anti-fuse memory cell, and output a second control signal to control the third switch element to be turned off; and obtain an output signal of the comparator at a second time point to determine the storage state of the anti-fuse memory cell, wherein the second time point is later than the first time point.

12. The memory of claim 11, wherein the second time point is determined by:

obtaining a maximum resistance of the anti-fuse memory cell after breakdown and a minimum resistance of the anti-fuse memory cell before breakdown;

determining a first voltage variation curve and a second voltage variation curve for the first node according to the power supply, the maximum resistance and the minimum resistance; and setting, as the second time point, a time point when a difference between voltage values of the first voltage variation curve and the second voltage variation curve reaches a preset threshold value.

13. The memory of claim 12, wherein the second reference voltage is determined by:

determining a first voltage value of the first voltage variation curve at the second time point and a second voltage value of the second voltage variation curve at the second time point; and setting an average value of the first voltage value and the second voltage value as the second reference voltage.

14. The memory of claim 10, wherein the state detection circuit further comprises:

a detection capacitor, which has a first terminal connected with the third node and a second terminal that is grounded.

15. The memory of claim 10, wherein the state detection circuit further comprises:

a trigger, which has an input terminal connected with an output terminal of the comparator, and a first output terminal and a second output terminal both connected with the controller.

16. The memory of claim 10, wherein the anti-fuse memory cell comprises:

a selection switch element, which has a first terminal used as the bit line of the anti-fuse memory cell; and an anti-fuse element, which has a first terminal connected with a second terminal of the selection switch element, wherein a control terminal of the selection switch element and a control terminal of the anti-fuse element are connected with the controller.

17. The memory of claim 10, wherein the first switch element and the second switch element are P-type transistors, the first input terminal of the amplifier is a non-inverting input terminal, and the second input terminal is an inverting input terminal; or, the first switch element and the second switch element are N-type transistors, the first input terminal of the amplifier is an inverting input terminal, and the second input terminal is a non-inverting input terminal.

18. The memory of claim 11, wherein obtaining the output signal of the comparator comprises:

controlling the comparator to be at an enabled state at the second time point so as to read the output signal of the comparator.

* * * * *